US006521842B2

(12) United States Patent
Brinthaupt, III et al.

(10) Patent No.: US 6,521,842 B2
(45) Date of Patent: Feb. 18, 2003

(54) HYBRID SURFACE MOUNT AND PIN THRU HOLE CIRCUIT BOARD

(75) Inventors: Mark R. Brinthaupt, III, Endicott, NY (US); Lisa J. Jimarez, Newark Valley, NY (US); William F. Wildey, Kirkwood, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/885,614

(22) Filed: Jun. 20, 2001

(65) Prior Publication Data

US 2003/0006061 A1 Jan. 9, 2003

(51) Int. Cl.[7] .................................................. H05K 1/00
(52) U.S. Cl. ........................ 174/252; 174/255; 174/266; 361/792; 361/795
(58) Field of Search ................................ 174/262, 263, 174/264, 265, 266, 252; 361/792, 793, 794, 795

(56) References Cited

U.S. PATENT DOCUMENTS

| 5,363,280 A | | 11/1994 | Chobot et al. |
| 5,371,653 A | * | 12/1994 | Kametani et al. ............ 361/721 |
| 5,451,720 A | * | 9/1995 | Estes et al. .................. 174/250 |
| 5,473,813 A | | 12/1995 | Chobot et al. |
| 5,590,030 A | * | 12/1996 | Kametani et al. ............ 361/794 |
| 5,743,004 A | | 4/1998 | Chobot et al. |
| 6,080,012 A | | 6/2000 | Zhu et al. |

FOREIGN PATENT DOCUMENTS

| JP | 04223396 | * | 8/1992 | ............ H05K/3/46 |
| JP | 09162516 | * | 6/1997 | ............ H05K/1/11 |

OTHER PUBLICATIONS

Fry et al., Fixtureless Component Placement and Reflow for Screenless Surface Mounted Technology Process, Research Disclosure, Jul. 1986, No. 267.
IBM Technical Disclosure Bulletin, vol. 29, No. 6, Nov. 1986, Alternative Leaded Package for Surface–Mounted Components, p. 2486.

* cited by examiner

Primary Examiner—Albert W. Paladini
Assistant Examiner—José H. Alcalá
(74) Attorney, Agent, or Firm—Schmeiser, Olsen & Watts; Lawrence R. Fraley

(57) ABSTRACT

A multi-layer circuit board is disclosed. The circuit board comprises a plurality of conductive planes; a plurality of plated through hole sets, each set comprising one or more plated through holes, none to all of the plated through holes of each set contacting at least one the conductive plane; a thermal break formed around each plated through hole in each conductive plane to which the plated through hole is connected; and one or more thermal vents, in the vicinity of each plated through hole in each conductive plane to which the plated through hole is connected. Additionally, surface mount technology pads are provided on a top surface of the circuit board.

22 Claims, 12 Drawing Sheets

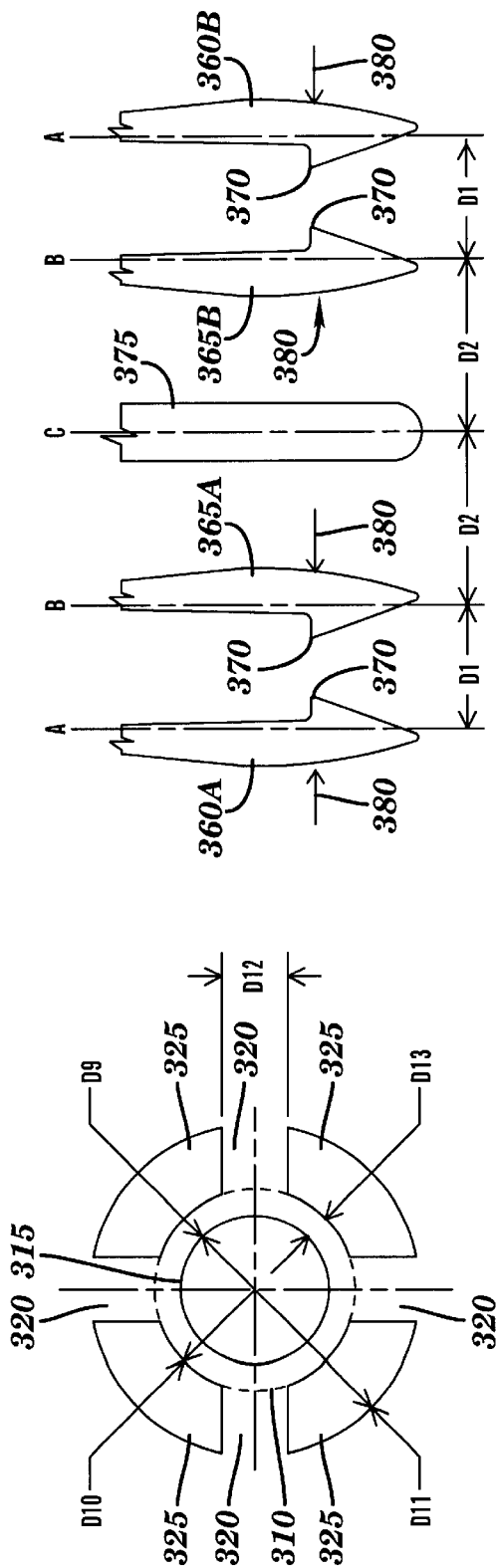
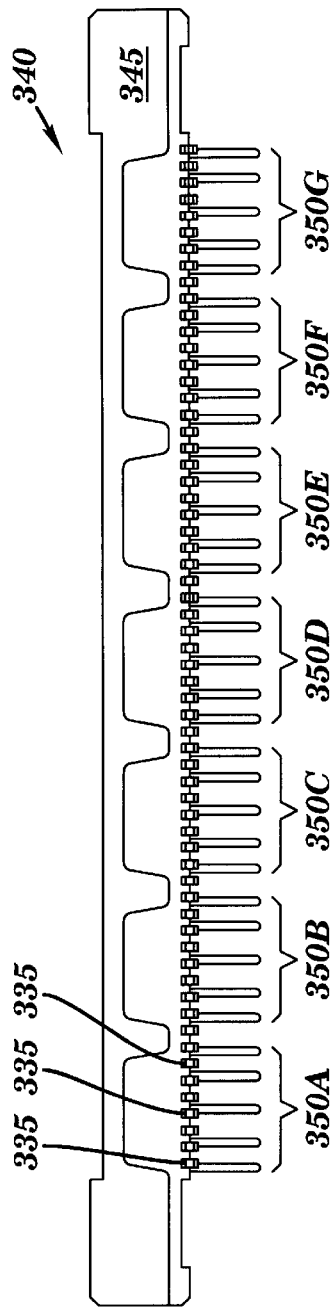
FIG. 13
FIG. 11
FIG. 12

HYBRID SURFACE MOUNT AND PIN THRU HOLE CIRCUIT BOARD

FIELD OF THE INVENTION

The present invention relates to the field of multi-layer circuit boards; more specifically, it relates to multi-layer hybrid surface mount technology (SMT)/pin in hole (PIH) circuit board and a method for soldering a multi-layer hybrid SMT/PIH connector to the board.

BACKGROUND OF THE INVENTION

During assembly of a hybrid SMT/PIH connector to a hybrid SMT/PIH circuit printed circuit board (PCB), two goals must be accomplished. First the SMT connects on the connector must be soldered to the SMT pads on the PCB and second, the pins on the connector must be soldered in the PIHs on the PCB. During rework of a hybrid SMT/PIH printed circuit board (PCB), specifically in the process of removing a hybrid SMT/PIH connector from the board, three goals must be accomplished. First, the proper degree of heat must be maintained to allow the solder securing the SMT connects to the PCB to reach and remain at the solder reflow temperature. Second, the proper degree of heat must be maintained to allow the solder securing the pin connects to the PCB to reach and remain at the solder reflow temperature. Third, it is necessary to prevent the heat applied, especially to the pin connects, from dispersing through the PCB to adjacent components and causing damage to the PCB and components attached thereto. Note that whenever the term PCB is used the more generic term circuit board (CB) may be substituted.

It is common to mount connectors (or active components) to PCBs by inserting pins extending from connectors into plated through holes (PTHs) in the PCB and wave soldering them in place. The PTHs normally provide connections between the pins and conductive planes. Conductive planes may be power planes or signal planes containing signal lines situated at various levels of the PCB. In the case of a connector, the PTHs provide connection to power planes in the PCB. It is also common to mount connectors (or active components) to PCBs using SMT technology using solder paste applied to the SMT pads on the PCB. It is the combination of the two interconnect technologies, SMT and PIH that presents soldering and de-soldering challenges. Hybrid SMT/PIH connectors have hereto been soldered using solder paste applied to the SMT pads as well as filling the PTHs with solder paste.

Particularly challenging is the case where pins must be soldered to PTHs connected to different numbers of power planes in a multi-layer PCB. Heat is normally conducted away from the PTH by the power planes inhibiting the solder from reaching the solder reflow temperature. The more power planes connected to a PTH the more heat is conducted away. Thus, some pins become hotter than other pins during soldering (or some do not become hot enough), and some pins remain cooler than other pins (or some pins become too hot, damaging the PCB) during de-soldering.

Turning to the figures, FIG. 1 is a partial top view of a related art hybrid SMT/PIH circuit board. In FIG, 1, PCB 100 is a hybrid SMT/PIN PCB and includes a plurality of SMT pads 105 disposed on a top surface 106 of the PCB. Also formed in PCB 100 are a plurality of PTHs. Three PTHs 110A, 110B and 110C are illustrated. PTH 110A includes a plated barrel 115A and a lip 120A. PTH 110B includes a plated barrel 115B and a lip 120B. PTH 110C includes a plated barrel 115C and a lip 120C. SMT pads 105 and lips 120A, 120B and 120C may be formed by subtractive etching of a copper layer formed on top surface 106 of PCB 100. Plated barrels 115A, 115B and 115C may be formed by drilling through PCB board 100 and plating the sidewalls of the resulting hole.

FIG. 2 is a partial cross-sectional view of the hybrid SMT/PIH circuit board through line 2—2 of FIG. 1. As may be seen in FIG. 2, each of PTHs 110A, 110B and 110C extends from top surface 106 to a bottom surface 112 of PCB 100. In FIG. 2, PCB board 100 is comprised of a plurality of (in this example, twelve) power planes 121 through 132. Plated barrel 115A of PTH 110A is connected to one power plane, power plane 123. Plated barrel 115B of PTH 110B is connected to three power planes; power planes 122, 125 and 129. Plated barrel 115C of PTH 110C is connected to six power planes; power planes 121, 124, 126, 127, 130 and 132. A plurality of signal lines 150 are dispersed between power planes 121 through 132 in a plurality of signal planes 155. Signal planes 155 are separated from power planes 121 through 132 by dielectric material. In one example the "sandwich" structure of PCB 100 may be formed by etching a signal plane on one side and a power plane on the other side of a printed circuit board joining multiple boards with epoxy or other dielectric adhesive, wherein the dielectric material is epoxy/glass material, fluropolymer, allyated polyphenyl esters, cyanate ester epoxy,( i.e. epoxy, PTFE, or other known dielectric) on one side of signal lines 150 and epoxy or other dielectric adhesive known in the art on the other side of the signal lines.

Also illustrated in FIG. 2 is a connecter 160. Connector 160 is a hybrid SMT/PIH connector and includes a plurality of SMT connectors 165 and a plurality (in this example, three) of pins 170A, 170B and 170C. A plurality of SMT connectors 165 are attached to SMT pads 105 by SMT solder joints 175 and pins 170A, 170B and 170C are attached respectively to PTHs 110A, 110B, and 110C by PTH solder joints 180A, 180B and 180C respectively.

FIG. 3 is a partial side view of the hybrid SMT/PIH circuit board of FIG. 1. In FIG. 3, connector 160, one pair of SMT connectors 165 and one pin 170 are illustrated. SMT connector 165 is attached to SMT pad 105 by SMT solder joint 175 and pin 170 is attached to plated barrel 115 by PTH solder joint 180.

FIG. 4 is a partial view of power plane 123 through line 4—4 of FIG. 2. SMT pads 105 are shown by dashed lines for reference purposes only and are obviously not present in power plane 123. In FIG. 4, plated barrel 115A of PTH 110A is co-extensive with power plane 123. Each plated barrel 115B and 115C of PTH holes 110B and 110C are separated from power plane 123 by a gap 185. Gaps 185 are filled with epoxy or other dielectric adhesive during the assembly pf PCB 100.

SUMMARY OF THE INVENTION

A first aspect of the present invention is a multi-layer circuit board, comprising: a plurality of conductive planes; a plurality of plated through hole sets, each set comprising one or more plated through holes, none to all of the plated through holes of each set contacting at least one conductive plane; a thermal break formed around each plated through hole in each conductive plane to which the plated through hole is connected; and one or more thermal vents, in the vicinity of each plated through hole in each conductive plane to which the plated through hole is connected.

A second aspect of the present invention is s method of fabricating a multi-layer circuit board, comprising: forming a plurality of conductive planes; forming a plurality of plated through hole sets in at least one of the conductive plane, each set comprising one or more plated through holes, none to all of the plated through holes of each set contacting at least one conductive plane; forming a thermal break around each plated through hole in each conductive plane to which the plated through hole is connected; forming one or more thermal vents, in the vicinity of each plated through hole in each conductive plane to which the plated through hole is connected; placing the conductive planes on top of each other with a dielectric layer located between the conductive planes; and joining the conductive planes together to form the multi-layer circuit board.

A third aspect of the present invention is A method of attaching a hybrid pin in hole/surface mount technology connector or component to a multi-layer circuit board, comprising: providing the hybrid pin in hole/surface mount technology connector or component comprising a body having a plurality of pins and surface mount connectors mounted thereon; providing the multi-layer circuit board comprising; a plurality of conductive planes; a plurality of surface mount technology pads formed on a top surface of the multi-layer circuit board; a plurality of plated through hole sets, each set comprising one or more plated through holes, none to all of the plated through holes of each set contacting at least one the conductive plane; a thermal break formed around each plated through hole in each conductive plane to which the plated through hole is connected; and one or more thermal vents, in the vicinity of each plated through hole in each conductive plane to which the plated through hole is connected; screening solder paste on to the surface mount technology pads; inserting the hybrid pin in hole/surface mount technology connector or component into the multi-layer circuit board; reflowing the solder paste to solder the surface mount connectors to the surface mount pads; and wave soldering the pins to the plated through holes from a bottom surface of the multi-layer board.

A fourth aspect of the present invention is a multi-layer circuit board comprising: first and second plated through holes, each adapted to having a pin positioned therein; the first and second plated through holes each connected to a different number of conductive planes contained within the circuit board; and the conductive planes having thermal breaks and thermal vents positioned around the plated through holes in each of the planes to which each plated through hole is connected, the thermal breaks assuring sufficient heat retention within each plated through hole to allow formation of a solder joint between the pins and the plated through holes, the pins being at different temperatures during formation of the solder joint.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 11 schematic of any thru-hole 315 of FIG. 10;

FIG. 12 is a detail side view of a Mictor™ connector;

FIG. 13 a detail of a 5-pin set of a Mictor™ connector; and

DETAILED DESCRIPTION OF THE INVENTION

Figure 1:
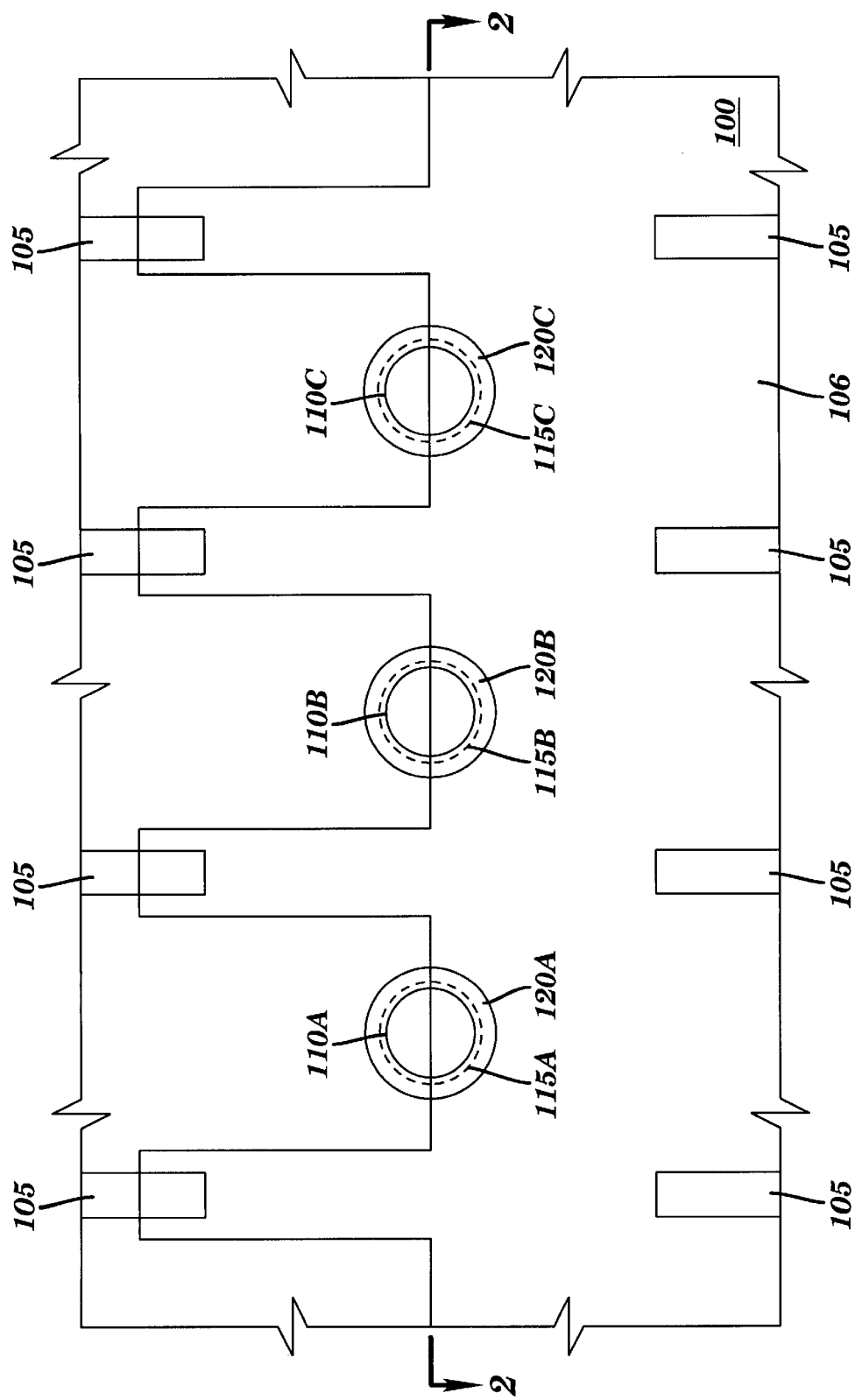
FIG. 1 is a partial top view of a related art hybrid SMT/PIH circuit board.
Figure 2:
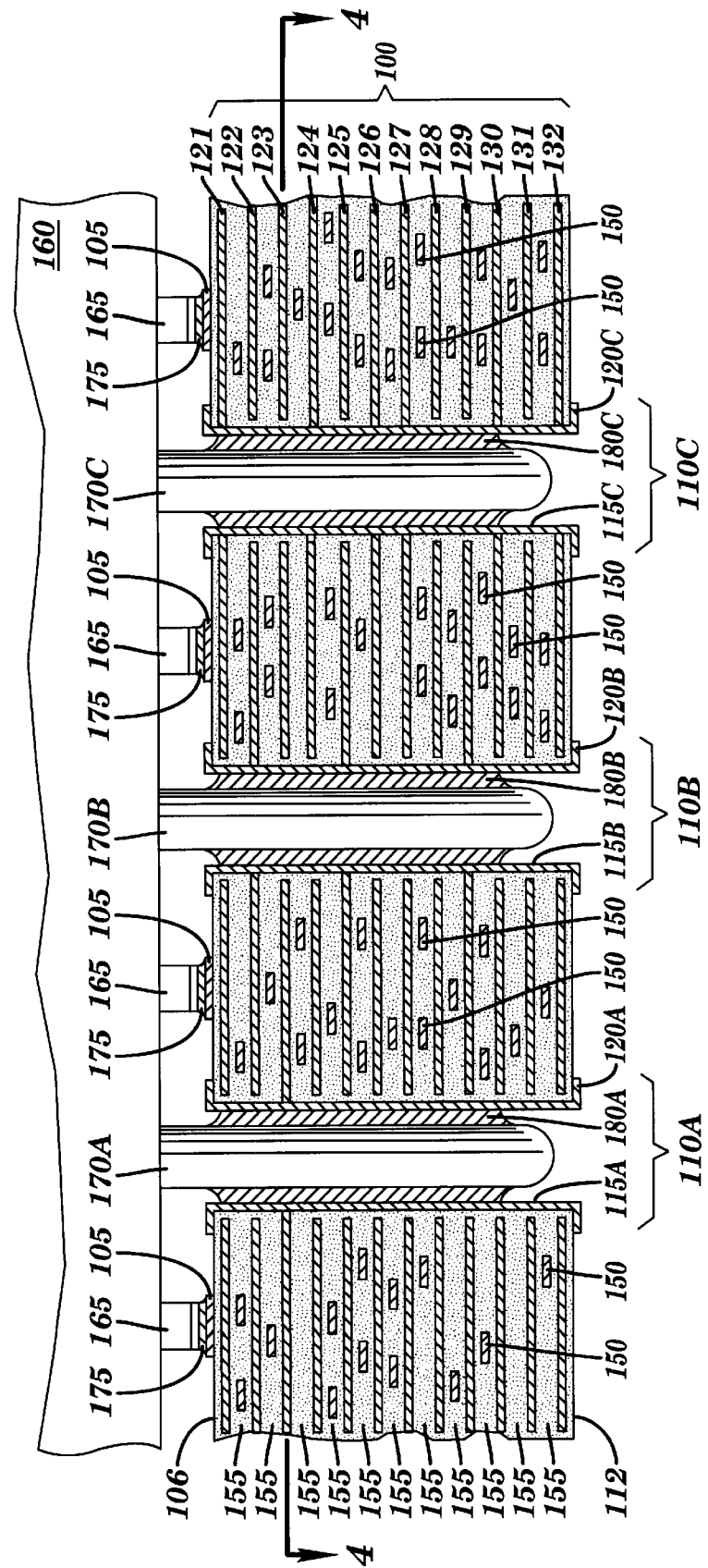
FIG. 2 is a partial cross-sectional view of the hybrid SMT/PIH circuit board through line 2—2 of FIG. 1.
Figure 3:
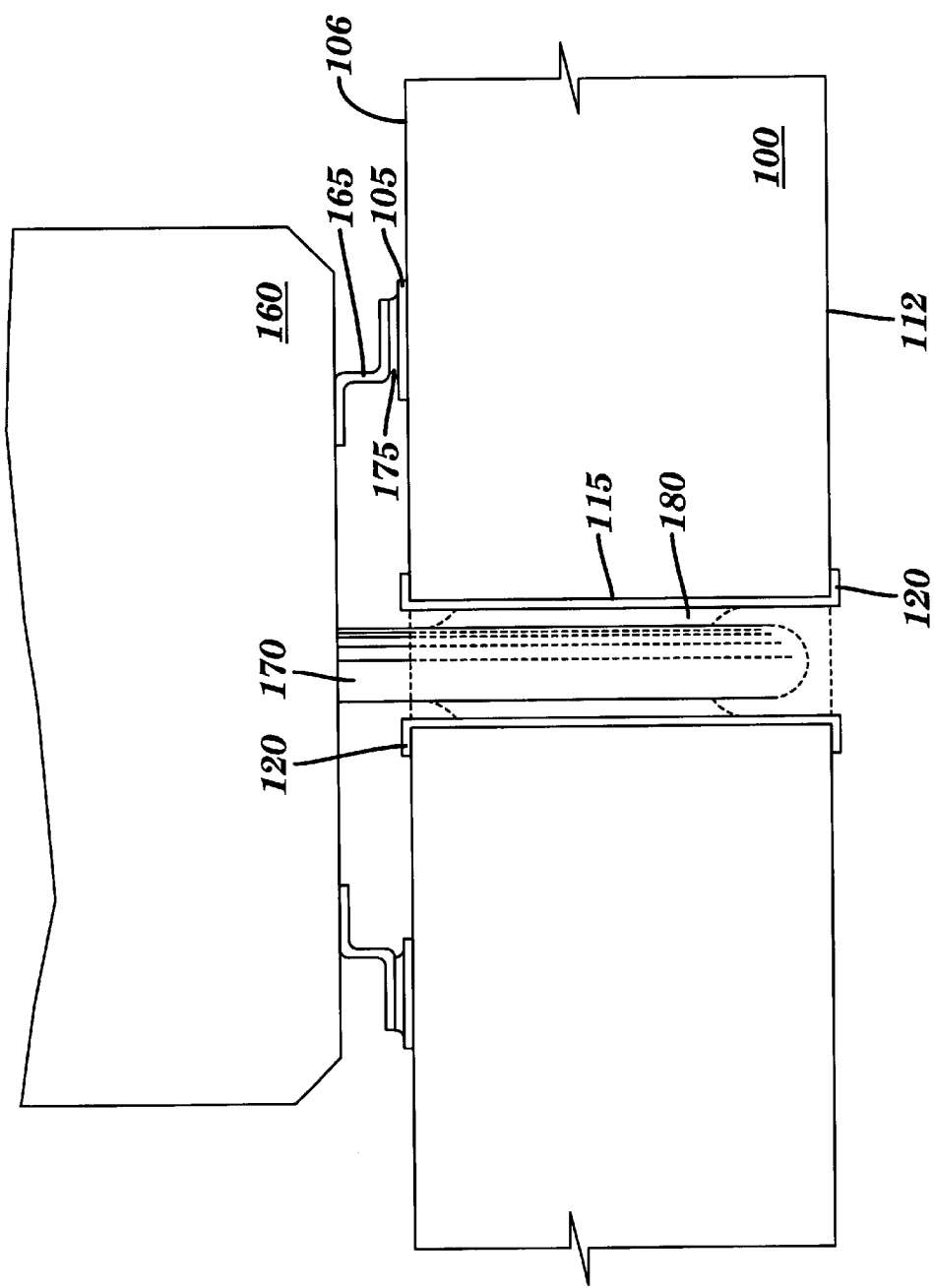
FIG. 3 is partial side view of the hybrid SMT/PIH circuit board of FIG, 1.
Figure 4:
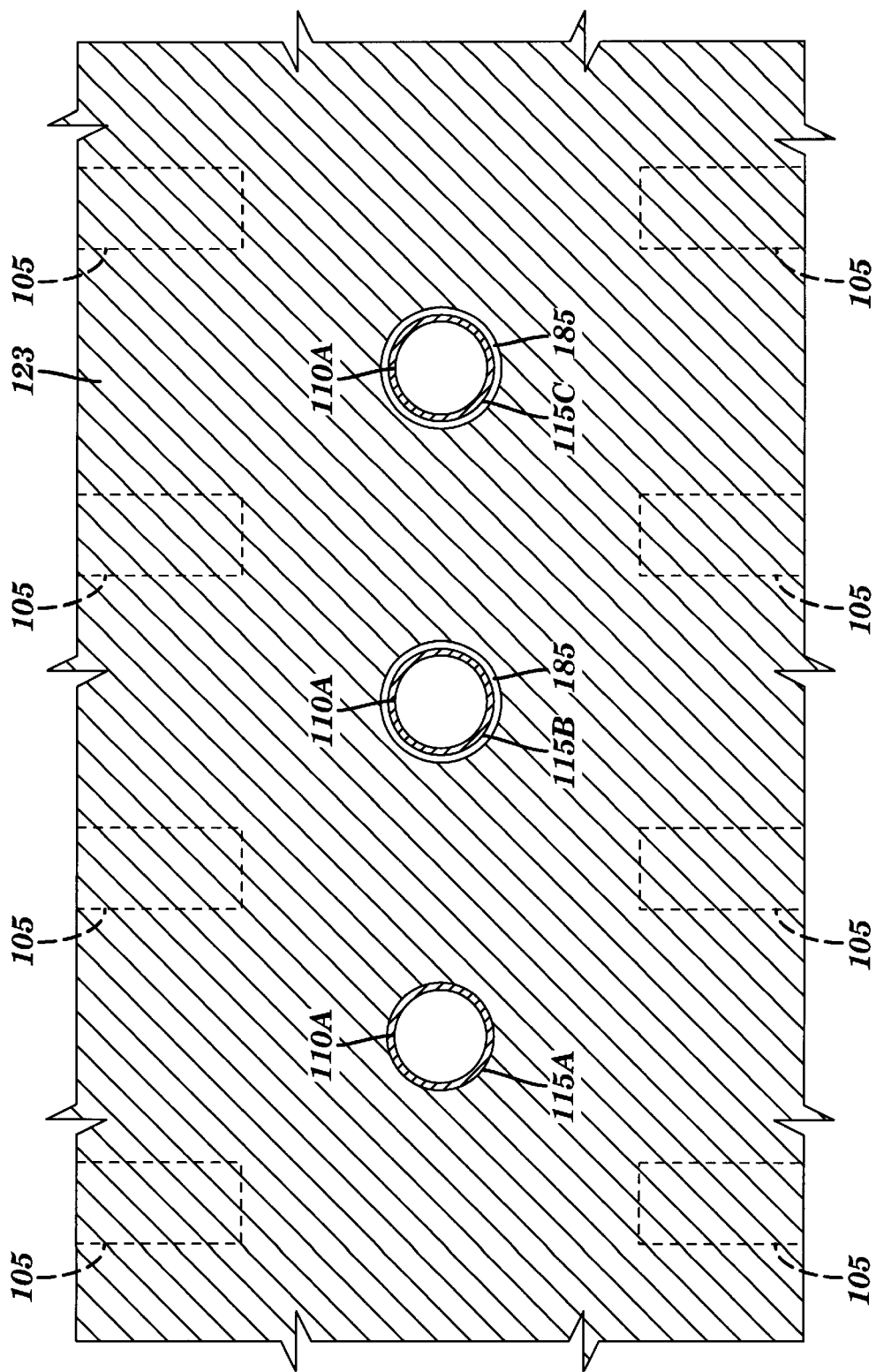
FIG. 4 is view of power plane 123 through line 4—4 of FIG. 2.
Figure 5:
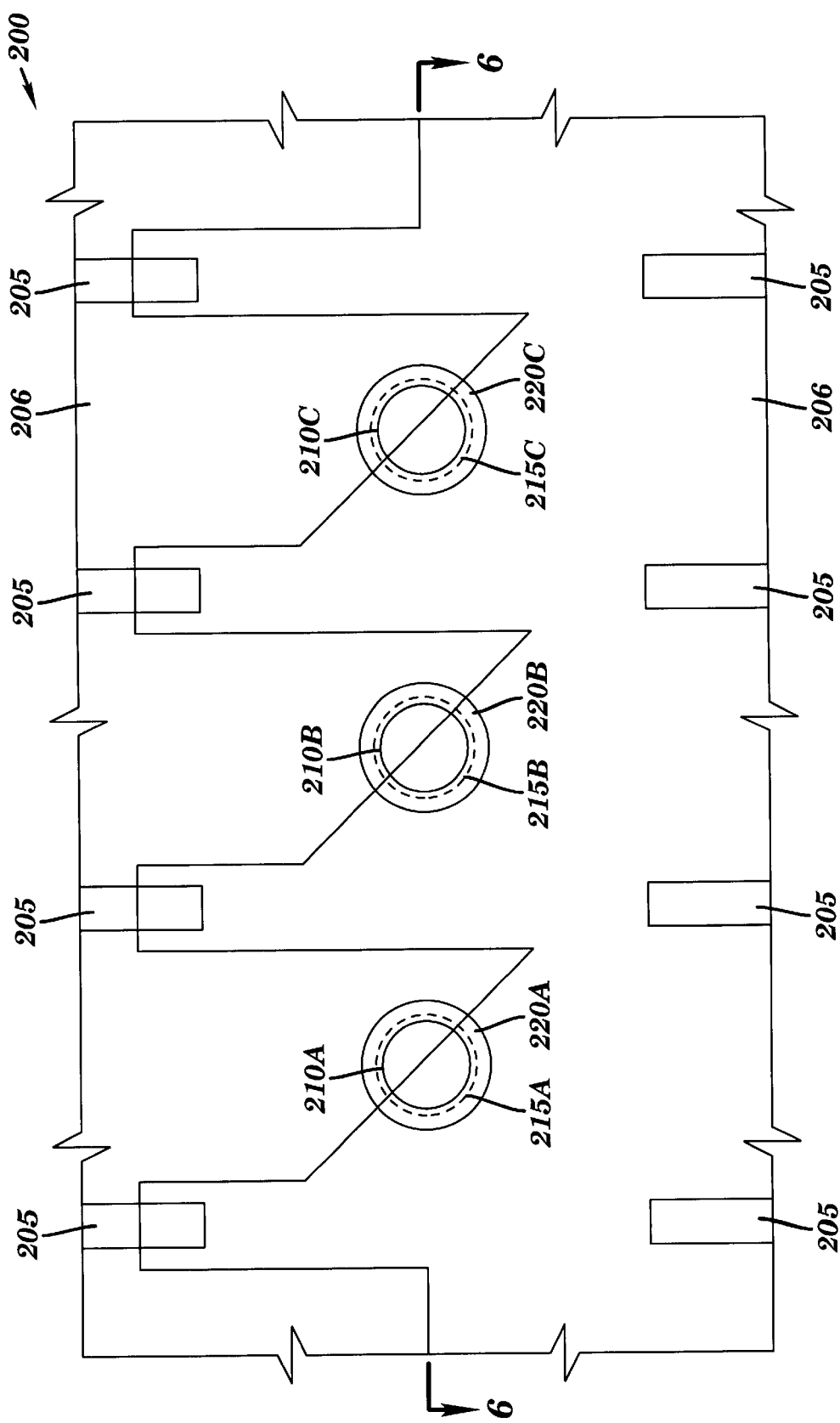
FIG. 5 is a partial top view of a hybrid SMT/PIH circuit board according to the present invention.

FIG. 5 is a partial top view of a hybrid SMT/PIH circuit board according to the present invention. In FIG, 5, PCB 200 is a hybrid SMT/PIN PCB and includes a plurality of SMT pads 205 disposed on a top surface 206 of the PCB. Also formed in PCB 200 are a plurality of PTHs. Three PTHs 210A, 210B and 210C are illustrated. Each of PTHs 210A, 210B and 210C extends from top surface 206 to a bottom surface 212 (see FIG. 6)of PCB 200. PTH 210A includes a plated barrel 215A and a lip 220A. PTH 210B includes a plated barrel 215B and a lip 220B. PTH 210C includes a plated barrel 215C and a lip 220C. SMT pads 205 and lips 220A, 220B and 220C may be formed by subtractive etching of a copper layer formed on top surface 206 of PCB 200. Plated barrels 215A, 215B and 215C may be formed by drilling through PCB board 200 and plating the sidewalls of the resulting hole.

Figure 6:
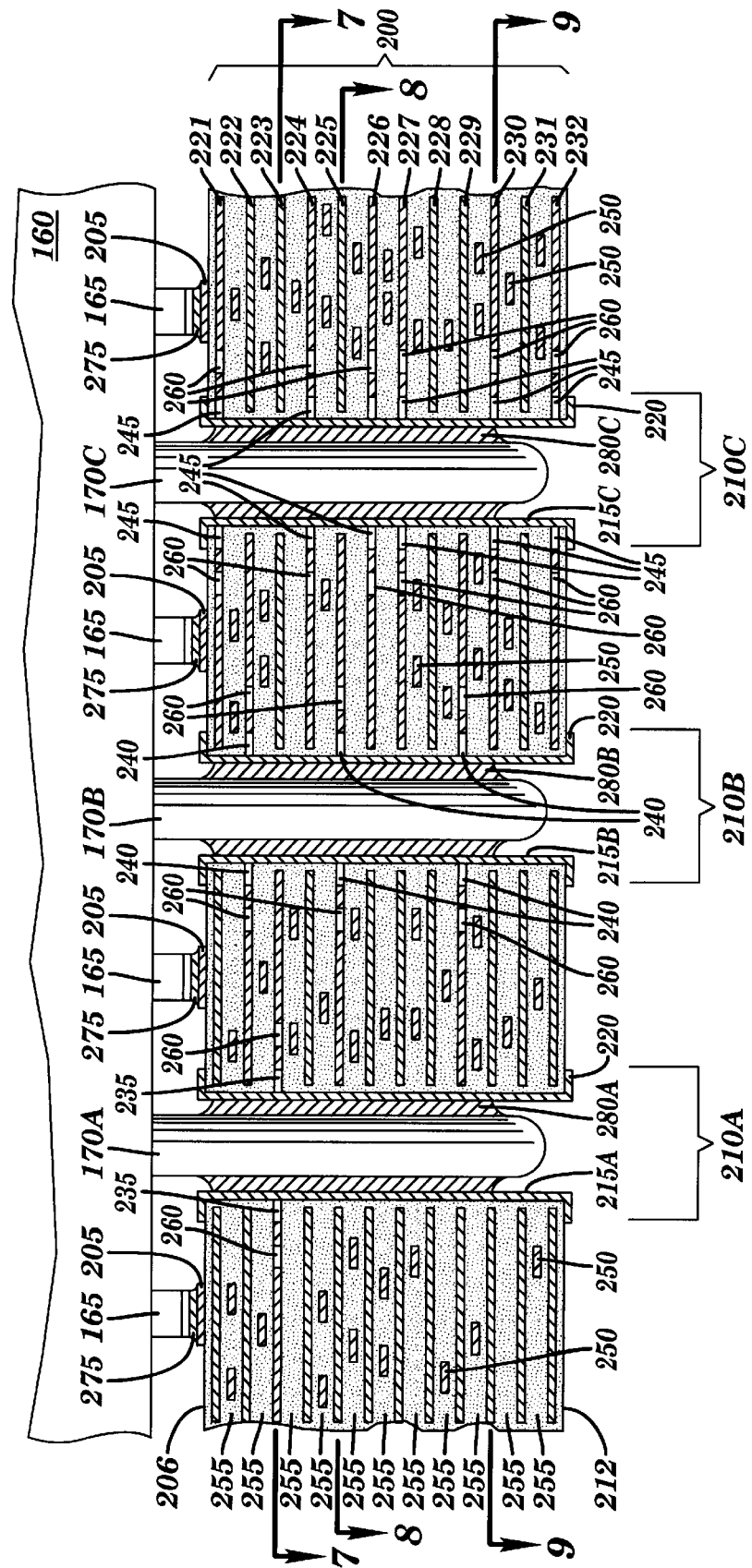
FIG. 6 is a partial cross-sectional view of the hybrid SMT/PIH circuit board through line 6—6 of FIG. 5.

FIG. 6 is a partial cross-sectional view of the hybrid SMT/PIH circuit board through line 6—6 of FIG. 5. In FIG. 6, PCB board 200 is comprised of a plurality of (in this example, twelve) power planes 221 through 232. Plated barrel 215A of PTH 210A is connected to one power plane, power plane 223 but in the present view is shown separated from the power plane by thermal breaks 235. Plated barrel 215B of PTH 210B is connected to three power planes, power planes 222, 225 and 229 but in the present view is shown separated from the power planes by thermal breaks 240. Plated barrel 215C of PTH 210C is connected to six power planes, power planes 221, 224, 226, 227, 230 and 232 but in the present view is shown separated from the power planes by thermal breaks 245. A plurality of signal lines 250 are dispersed between power planes 221 through 232 in a plurality of signal planes 255. Signal planes 255 are separated from power planes 221 through 232 by dielectric material, for example epoxy/fiberglass on one side of signal lines 250 and epoxy or other dielectric adhesive known in the art on the other side of the signal line. PCB 200 may be formed as described for PCB 100 above.

Each power plane 221 through 232 may be formed of material, such as copper, having a thickness of about 0.0014 and weighing about 1.0 ounce per square foot. Additionally, power planes comprising 0.5 ounce (0.007 inch thick) or 2.0 (0.0028 inch thick) ounce, material may also be incorporated into PCB 200.

Each power plane that is connected to a barrel 215A, 215B or 215C of a PTH 210A, 210B or 210C respectively, also has at least one thermal vent 260 formed in the power plane in the vicinity of the PTH. In the present example, four thermal vents 260 are formed in the vicinity of each PTH 210A, 210B and 210C, with the PTH centered in the group of four thermal vents. The configuration of thermal breaks 235, 240 and 245 and thermal vents 260 are more clearly illustrated in FIGS. 7, 8, and 9 and described below. Thermal vents and thermal breaks are only placed around a PTH that connect to one or more power planes and then only in the power planes that the PTH is connected to.

Also illustrated in FIG. 6 is connecter 160. SMT connectors 165 are attached to SMT pads 205 by SMT solder joints 275 and pins 170A, 170B and 170C are attached respectively to PTHs 210A, 210B, and 210C by PTH solder joints 280A, 280B and 280C respectively.

Figure 7:
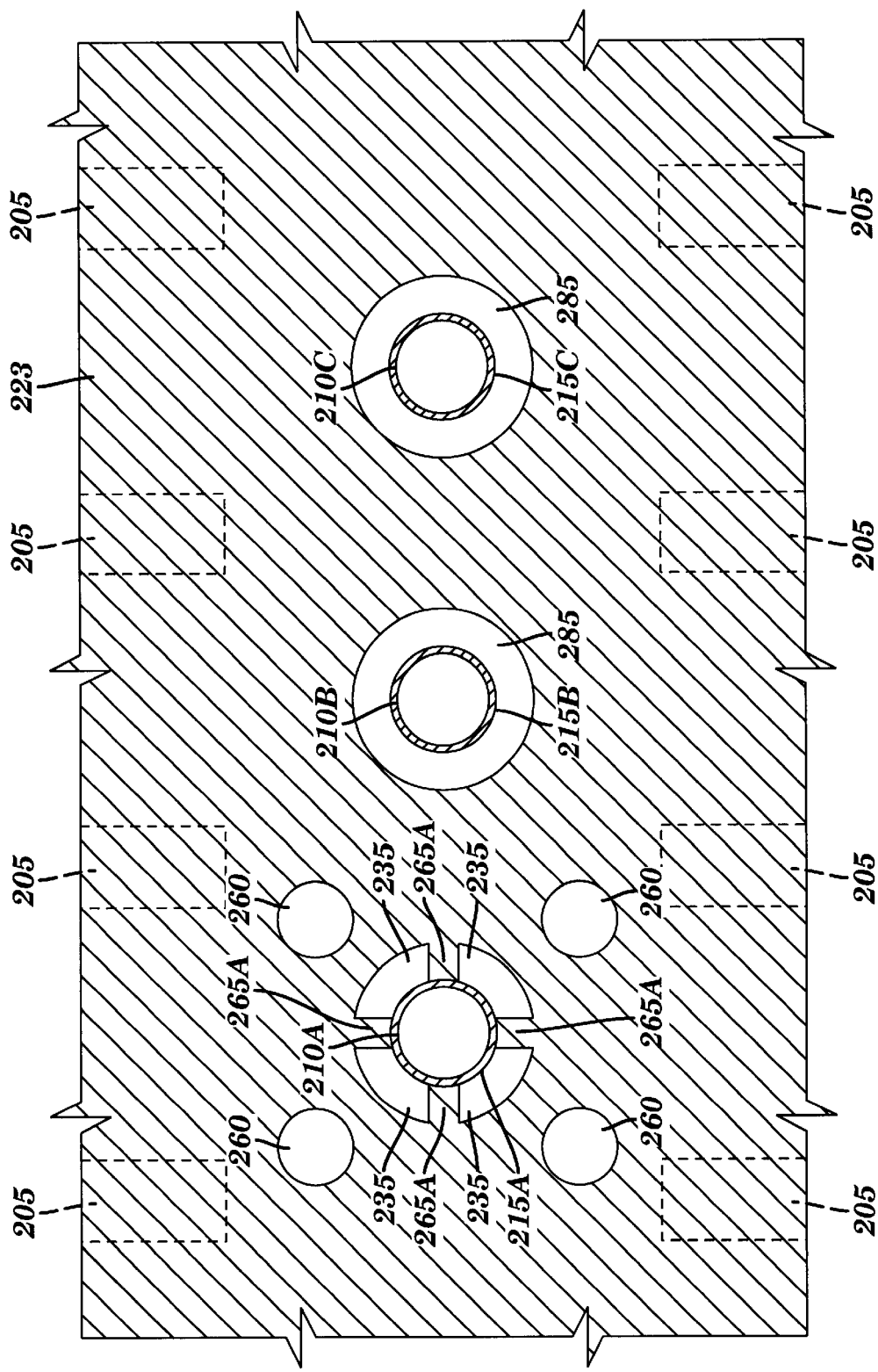
FIG. 7 partial view of a power plane 223 through line 7—7 of FIG. 6.

FIG. 7 is a partial view of a power plane 223 through line 7—7 of FIG. 6. SMT pads 205 are shown by dashed lines for reference purposes only and are obviously not present in power plane 223. In FIG. 7, plated barrel 215A of PTH 210A is joined to power plane 223 by bridges 265A; otherwise, power plane 223 is separated from plated barrel 215A of PTH 210A by thermal breaks 235. Thermal breaks 235 extend substantially around PTH 215A and comprises arc segments of a ring centered on PTH 215A. Bridges 265A between arc segments are arranged like the spokes of a wheel. Thermal breaks 235 may be formed by removing conductive material from power plane 223. As the name implies, thermal breaks 235 function as thermal barriers. The combination of thermal breaks 235 and bridges 265A limits the heat flow from PTH 210A to power plane 223 during solder and de-solder of pin 170A while still allowing good conductivity between the PTH and the power plane.

Because PTHs 210B and 210C are not intended to connect to power plane 223, plated barrel 215A and 215B are separated from power plane 223 by gaps 285. Gaps 285 function not only as electrical discontinuities in power plane 223, but as thermal breaks as well and are wide enough to severely limit thermal conduction from plated barrels 215B and 215C of PTHs 210B and 210C to the power plane during solder and de-solder of pins 170B and 170C However, because there is still a physical connection (bridges 265A) between PTH 210A and power plane 223, there is still more heat flow between PTH 210A and the power plane than between PTH 210B or 210C and the power plane. This is corrected by the placement of thermal vents 260 around PTH 210A. Thermal vents 260 may be formed by removing conductive material from power plane 223. The combination of thermal breaks 235 and thermal vents 260 provide about the same degree of thermal isolation as gaps 285 provide.

Thermal breaks 235, thermal vents 260 and gaps 285 are filled with epoxy or other dielectric adhesive known in the art during the assembly of PCB 200.

Figure 8:
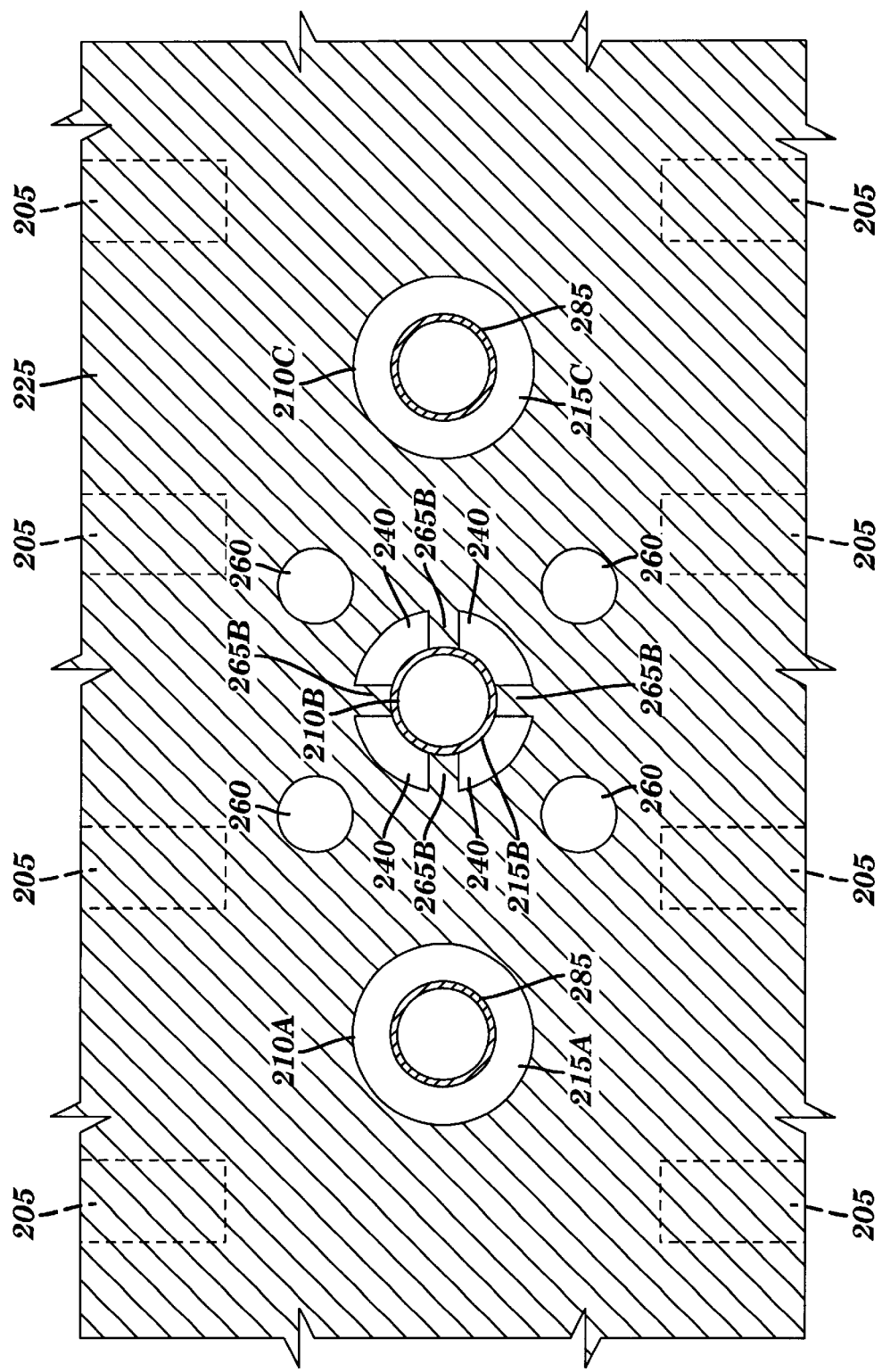
FIG. 8 is a partial view of a power plane 225 through line 8—8 of FIG. 6.

FIG. 8 is a partial view of a power plane 225 through line 8—8 of FIG. 6. SMT pads 205 are shown by dashed lines for reference purposes only and are obviously not present in power plane 225. In FIG. 8, plated barrel 215B of PTH 210B is joined to power plane 225 by bridges 265B; otherwise, power plane 225 is separated from plated barrel 215B of PTH 210B by thermal breaks 240. Thermal breaks 240 extend substantially around PTH 215B and comprises arc segments of a ring centered on PTH 215B. Bridges 265B between arc segments are arranged like the spokes of a wheel. Thermal breaks 240 may be formed by removing conductive material from power plane 225.

Because PTHs 210A and 210C are not intended to connect to power plane 225, plated barrels 215A and 215C are separated from power plane 225 by gaps 285 Thermal vents 260 are placed around PTH 210B. Thermal vents 260 may be formed by removing conductive material from power plane 223. Thermal breaks 240 vents 260 and gaps 285 are filled with epoxy or other dielectric adhesive known in the art during the assembly of PCB 200.

Figure 9:
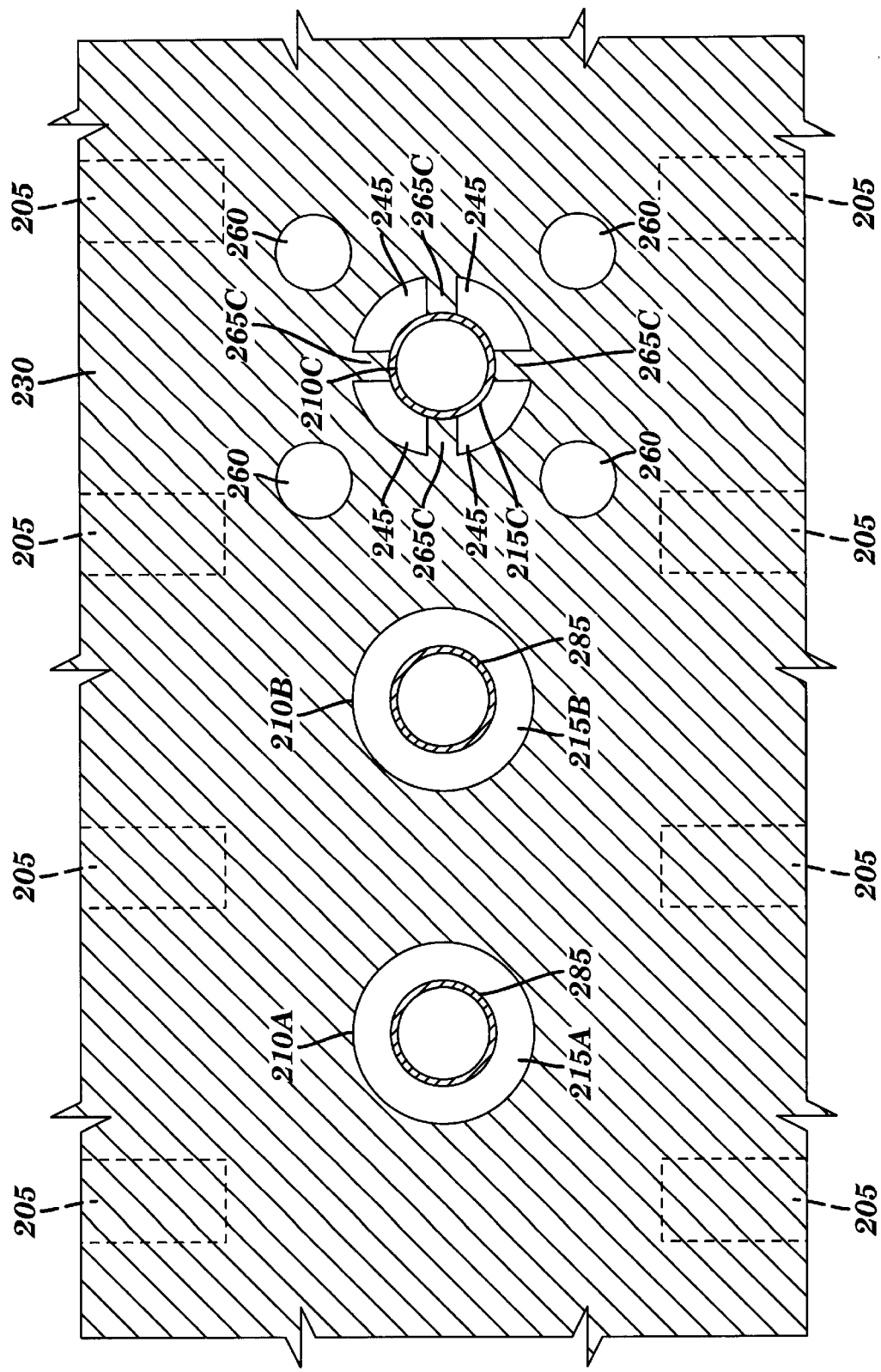
FIG. 9 is a partial view of a power plane 230 through line 9—9 of FIG. 6.

FIG. 9 is a partial view of a power plane 230 through line 9—9 of FIG. 6. SMT pads 205 are shown by dashed lines for reference purposes only and are obviously not present in power plane 230. In FIG. 9, plated barrel 215C of PTH 210C is joined to power plane 230 by bridges 265C; otherwise, power plane 230 is separated from plated barrel 215C of PTH 210C by thermal breaks 245. Thermal breaks 245 extend substantially around PTH 215C and comprises arc segments of a ring centered on PTH 215C. Bridges 265C between arc segments are arranged like the spokes of a wheel. Thermal breaks 245 may be formed by removing conductive material from power plane 230.

Because PTHs 210A and 210B are not intended to connect to power plane 230, plated barrels 215A and 215B are separated from power plane 230 by gaps 285. Thermal vents 260 are placed around PTH 210C. Thermal vents 260 may be formed by removing conductive material from power plane 230. Thermal breaks 245 thermal vents 260 and gaps 285 are filled with epoxy or other dielectric adhesive during the assembly of PCB 200.

Figure 10:
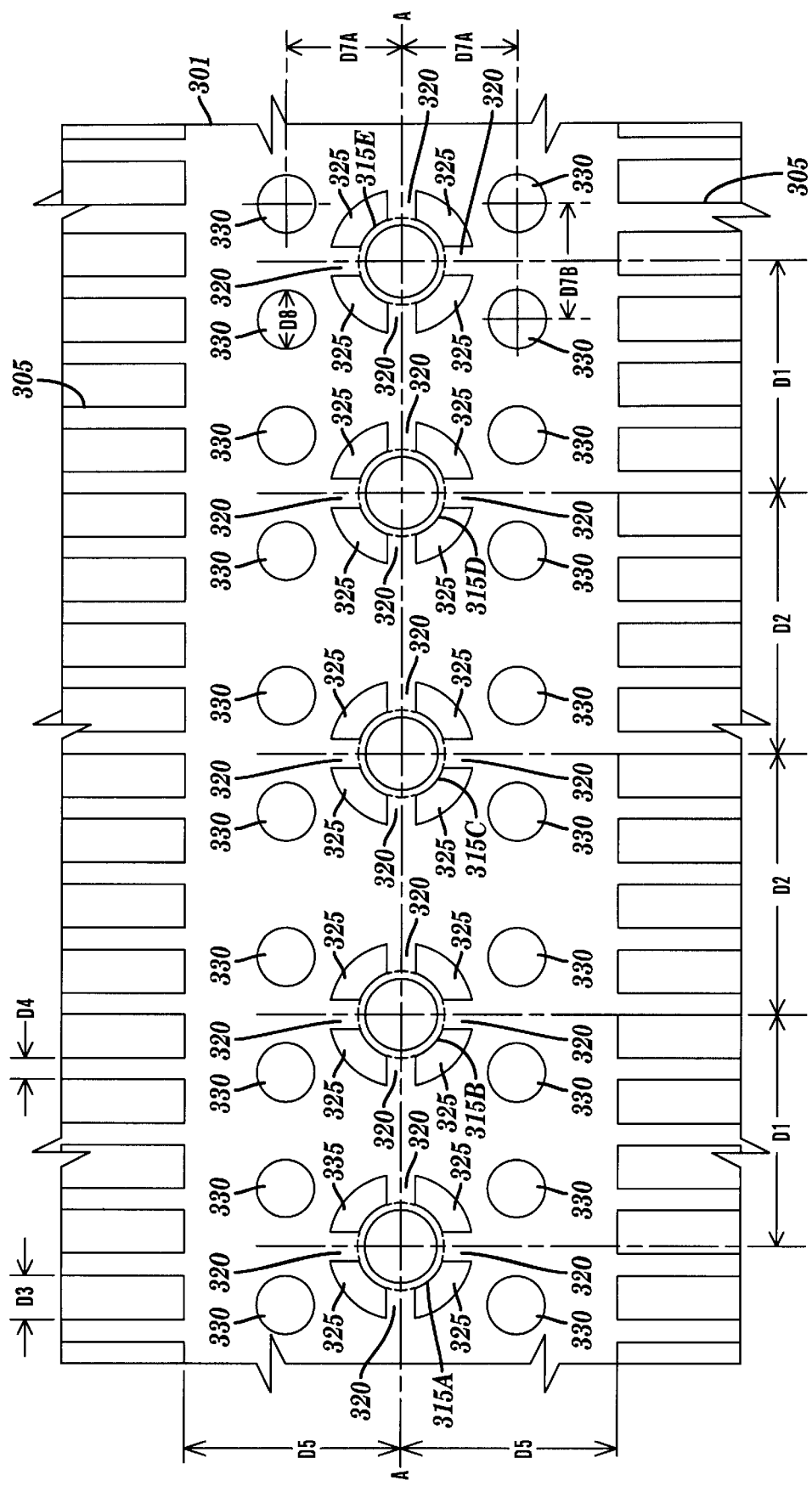
FIG. 10 is a partial top view of a power plane for a multi-layer hybrid SMT/PIH circuit board of the present invention adapted for,a Mictor™ connector.

FIG. 10 is a partial top view of a power plane for a multi-layer hybrid SMT/PIH circuit board of the present invention adapted for a Mictor™ connector manufactured by AMP Incorporated, Harrisburg, P.A. A Mictor™ connecter is illustrated in FIGS. 12 and 13 and described below. In this particular connector, adjacent pins are arranged, in this example, in groups of five and all five may be connected to the same power planes. An exemplary power plane 301 is illustrated in FIG. 10. A plurality of SMT pads 305 are shown by dashed lines for reference purposes only and are obviously not present in the power plane. Each of PTHs 315A through 315E is joined to power plane 300 by four bridges 320 separated by four thermal breaks 325. Thermal breaks 335 are arc segments of a ring centered on each PTH 315A through 315E. Thermal breaks 335 may be formed by removing conductive material from power plane 300. Four thermal vents 330 are placed around each of PTHs 315A through 315E. Thermal vents 330 may be formed by removing conductive material from power plane 300. Thermal breaks 325 and thermal vents 330 are filled with epoxy or other dielectric adhesive during the assembly of similar power planes 300 into a multi-layer PCB. A Mictor™ connector contains several groups of pins, each group tied to a different set of one or more power planes. Therefore other regions of power plane 330 where connector pins simply pass through with no electrical connection would be fabricated with a gap as illustrated in FIGS. 7, 8 and 9 and described above, and not with bridges, thermal breaks, and thermal vents.

For proper functioning of the present invention, certain dimensions are maintained. Some dimensions are specific to the connector and some are general to the present invention. The following dimensions are specific to the connector and vary from connector to connector (or component to component): PTH-to-PTH spacing "D1"=0.083 inch and "D2"=0.109 inch so that a line through the widest part of each pin in the connector aligns with the center of the through hole; SMT pad 305 width and spacing "D3"=0.017 inch and "D4"=0.008 inch, SMT pad 305 to PTH 315 spacing and "D5"=0.114 inch to match the SMT/PIN footprint of the connector. However, it is a feature of the invention that PTHs 315A through 315E are arranged with the exact same center to center spacing as the center to center spacing of the widest portion of pins on a connector or component to be soldered into said PTHs. Note the spacing need not be uniform. The following dimensions are general to the present invention: center of PTH-315 to center of thermal vent 330 spacing "D7A" is about 0.050 to 0.100 inch, center of thermal vent to adjacent thermal vent spacing "D7B" is about 0.025 to 0.050 inch and thermal vent 330 diameter "D8" is about 0.12 to 0.030 inch.

FIG. 11 is a schematic of any thru-hole 315 of FIG. 10. The dimensions of FIG. 11 are general to the present invention. The diameter of TH 315 "D9" is about 0.0.12 to 0.050 inch. The inside diameter of the arc segment of the thermal break 325 "D10" is about 0.032 to 0.070 inch. The outside diameter of the arc segment of the thermal break 325 "D11" is about 0.052 to 0.090 inch. The width of bridge 320 "D12" is about 0.005 to 0.015 inch.

FIG. 12 is a side view of a Mictor™ connector. Mictor™ connector 340 comprises a body and seven sets of five pins 350A through 350G. Connector 340 also includes a plurality of SMT connectors 335.

FIG. 13 is a detail of a 5-pin set of a Mictor™ connector. Outer pins 360A and 360B and inner pins 365A and 365B are barbed. Barbs 370 on pins 360A and 365A face one another as do barbs 370 on pins 360B and 365B. A center pin 375 is not barbed. Centerline "A" bisects the widest portions 380 of pins outer pins 360A and 360B to prevent scoring of any plated through hole the pins are inserted into. Centerline "B" bisects the widest portions 380 of inner pins 365A and 365B to prevent scoring of any plated through hole the pins are inserted into. By so positioning centerlines "A "and "B" rework is also made easier as barbs 370 to not gouge and lodge in the plated barrels of the plated through holes the pins may be inserted into. Centerline "C" bisects center pin 375.

Figure 14:
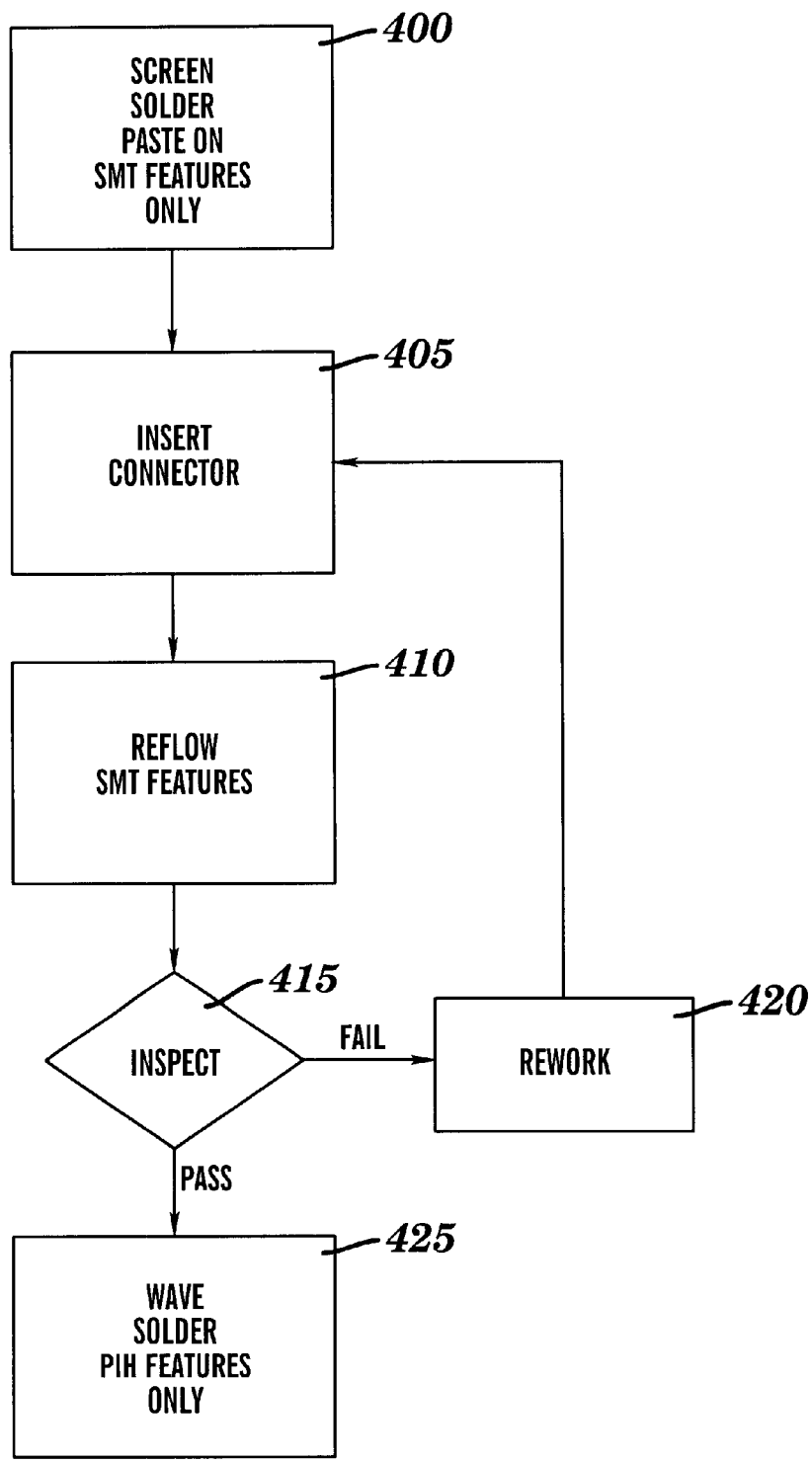
FIG. 14 is a flowchart illustrating a method of attaching a hybrid SMT/PIN connector or component to the hybrid SMT/PIN PCB of the present invention.

FIG. 14 is a flowchart illustrating a method of attaching a hybrid SMT/PIN connector or component to the hybrid SMT/PIN PCB of the present invention. In step 400, solder paste is screened on SMT pads 205 of PCB 200. In step 405, pins 170 of connector 160 are inserted into PTHs 210 of PCB 200. SMT connectors 165 of connector 160 make contact with the solder paste. In step 410, the solder paste is reflowed to form SMT solder joints 175. In one example, reflow is performed in a convection oven at about 134 to 265° C. using eutectic Pb/Sn solder (63% Sn, 37% Pb), Sn/Ag/Cu solder, SN/PB/Ag solder, Sn/Pb/In solder or Sn/Bi solder. In optional step 415, the assembly is inspected for stubbed pins or other defects. Stubbed pins are pins that have bent over and lie on top surface 206 of PCB 200 instead of being in PTHs 210. If stubbed pins or other defects are found, the process proceeds to step 420 for rework. In the case of eutectic Pb/Sn, rework comprises re-heating the bad connector or component until the solder melts, with a hot gas removal tool using gas heated to about 200 to 220° C. to melt the eutectic Pb/Sn solder, removing the connector or component, re-pasting the SMT pads affected and looping to step 405. The exact temperature reached by any given pin depends on the number of power planes the pins is connected to. For example, a pin connected to only one power plane may reach 210° C. while a pin connected to six power planes may only reach 190° C. The pin attached to the most power planes must be brought to at least the minimum reflow temperature. In step 425, pins 170 of connector 160 are soldered to PTHs 210 by wave soldering from the bottom 212 of PCB 200. In one example, wave soldering is performed at a solder bath temperature of 185° C. or higher using eutectic Pb/Sn solder (63% Sn, 37% Pb), Sn/Ag/Cu solder, SN/PB/Ag solder, Sn/Pb/In solder or Sn/Bi solder. Again, a pin connected to only one power plane may reach 210° C. while a pin connected to six power planes may only reach 190° C. The pin attached to the most power planes must be brought to at least the minimum temperature required to form a good bond. The SMT connection is performed first in order to eliminate the wave solder process from pushing out connector 160.

EXAMPLE

Table I shows the solder fill performance for PIN features for the Mictor™ connector using a solder paste in PTHs process to form PTH solder joints at the same time as SMT connections are made vs. a wave solder process to form the PTH solder joints after the SMT connections have been made by a solder paste process. For the wave solder process of the present invention, thermal breaks alone and the combination of thermal breaks and thermal vents were tested. For all processes, pins in PTHs connected to one power plane and six power planes were examined by cross-sectioning representative samples. Average sample size for each cell was 20. A 75%, 360-degree coverage fill meets minimum reliability targets.

TABLE I

| Process | One 1.0 Ounce Power Plane | Six 1.0 Ounce Power Planes |
| --- | --- | --- |
| Paste Process | 30% @ 225° | 30% @ 225° |
| Wave Solder Process | | |
| Thermal Breaks Only | 75% @ 360° | 30% @ 360° |
| Thermal Break and Vents | 75% @ 360° | 75% @ 360° |

Table I illustrates that the paste fill process does not give satisfactory solder fill even with pins connected to only one power plane. The wave solder process gave satisfactory results for PTHs using thermal breaks only when connected to one power plane, but not to six power planes. It was expected that thermal breaks would give satisfactory results with any number of power planes. Only by the use of both thermal breaks and thermal vents were satisfactory results achieved with pins in PTHs connected to six power planes.

The description of the embodiments of the present invention is given above for the understanding of the present invention. It will be understood that the invention is not to the particular embodiments described herein, but is capable of various modifications, rearrangements and substitutions such as will now become apparent to those skilled in the art without departing from the scope of the invention. Such modifications include changes in the number of bridges, thermal breaks and thermal vents associated with each PTH. Such rearrangements include changes in the layout of bridges, thermal breaks and thermal vents. Such substitutions include use of alternate materials in the place of copper, fiberglass and epoxy as well as substitution of active devices or components for connecters. Therefore, it is intended that the following claims cover all such modifications and changes as fall within the true spirit and scope of the invention.

What is claimed is:

1. A multi-layer circuit board for use with a connector or component having pins, comprising:

a plurality of conductive planes, each pair of adjacent conductive planes separated by a dielectric layer;

a plurality of plated through holes, none to all of said plated through holes electrically contacting at least one of said conductive planes, those plated through holes not electrically contacting a particular conductive plane electrically isolated from and passing through a gap in that particular conductive plane; and a plurality of thermal breaks formed around each plated through hole in each conductive plane to which said plated through hole is electrically connected, said thermal breaks located between said plated through hole and a plurality of thermal vents, said thermal vents located in a pattern around each plated through hole in each conductive plane to which said plated through hole is electrically connected.

2. The multi-layer circuit board of claim 1, wherein a distance between centers of adjacent plated through holes is the same as a distance between centers of the widest portions of corresponding pins on said connector or component that are contained within said plated through holes after insertion of said pins into said plated through holes.

3. The multi-layer circuit board of claim 1, further including surface mount technology pads formed on a top surface of said multi-layer circuit board.

4. The multi-layer circuit board of claim 1, wherein said thermal breaks are in the form of one or more segments of a ring.

5. The multi-layer circuit board of claim 4, wherein said ring segments are bounded by an inner arc segment of a circle having a diameter of 0.032 to 0.070 inches and an outer arc segment of a circle having a diameter of 0.052 to 0.090 inches.

6. The multi-layer circuit board of claim 1, wherein said thermal breaks extend entirely through said conductive planes.

7. The multi-layer circuit board of claim 4, wherein each plated through hole connected to each conductive plane is connected by one or more bridges between said thermal breaks, said bridges in the shape of spokes connected to and radiating from a plated barrel portion of said plated through hole to said conductive plane.

8. The multi-layer circuit board of claim 7, wherein said spokes are 0.005 inch to 0.015 inch wide.

9. The multi-layer circuit board of claim 1, wherein the distance between the center of said plated through holes to the center of said thermal vents is 0.050 inch to 0.100 inch and the center to center spacing of adjacent thermal vents is 0.025 to 0.050 inch.

10. The multi-layer circuit board of claim 9, wherein the diameter of said thermal vents is 0.12 inch to 0.030 inch.

11. The multi-layer circuit board of claim 1, wherein said thermal vents extend entirely through said conductive planes.

12. A multi-layer circuit board for use with a connector or a component having pins, comprising:

first and second plated through holes, each adapted to having one of said pins positioned therein;

said first and second plated through holes each electrically connected to a different number of conductive planes contained within said circuit board, each pair of adjacent conductive planes separated by a dielectric layer;

those plated through holes not electrically contacting a particular conductive plane being electrically isolated from and passing through a gap in that particular conductive plane;

said conductive planes having a plurality of thermal breaks positioned around said plated through holes in each of the planes to which each plated through hole is electrically connected, said thermal breaks located between each plated through hole and a plurality of thermal vents, said thermal vents located in a pattern around each plated through hole in each conductive plane to which each plated through hole is electrically connected; and said thermal breaks and said thermal vents assuring sufficient heat retention within each plated through hole to allow formation of a solder joint between said pins and said plated through holes, said pins being at different temperatures during formation of said solder joint.

13. The multi-layer circuit board of claim 12, wherein said plated through holes are arranged with the exact same center to center spacing as the center to center spacing of the widest portions of said pins to reduce scoring of said plated through holes by said pins.

14. The multi-layer circuit board of claim 12, further including surface mount technology pads formed on a top surface of said multi-layer circuit board.

15. The multi-layer circuit board of claim 12, wherein said thermal breaks are in the form of one or more segments of a ring.

16. The multi-layer circuit board of claim 15, wherein said ring segments are bounded by an inner arc segment of a circle having a diameter of 0.032 to 0.070 inches and an outer arc segment of a circle having a diameter of 0.052 to 0.090 inches.

17. The multi-layer circuit board of claim 12, wherein said thermal breaks extend entirely through said conductive planes.

18. The multi-layer circuit board of claim 15 wherein each plated through hole connected to each conductive plane is connected by one or more bridges between said thermal breaks, said bridges in the shape of spokes connected to and radiating from a plated barrel portion of said plated through hole to said conductive plane.

19. The multi-layer circuit board of claim 18, wherein said spokes are 0.005 inch to 0.015 inch wide.

20. The multi-layer circuit board of claim 12, wherein the distance between the center of said plated through holes to the center of said thermal vents is 0.050 inch to 0.100 inch and the center to center spacing of adjacent thermal vents is 0.025 to 0.050 inch.

21. The multi-layer circuit board of claim 20, wherein the diameter of said thermal vents is 0.12 inch to 0.030 inch.

22. The multi-layer circuit board of claim 12, wherein said thermal vents extend entirely through said conductive planes.

* * * * *